US011289310B2

(12) United States Patent
Cui et al.

(10) Patent No.: US 11,289,310 B2
(45) Date of Patent: *Mar. 29, 2022

(54) CIRCUITS FOR EDGE RING CONTROL IN SHAPED DC PULSED PLASMA PROCESS DEVICE

(71) Applicant: Applied Materials, Inc., Santa Clara, CA (US)

(72) Inventors: Linying Cui, Sunnyvale, CA (US); James Rogers, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 132 days.

This patent is subject to a terminal disclaimer.

(21) Appl. No.: 16/198,479

(22) Filed: Nov. 21, 2018

(65) Prior Publication Data

US 2020/0161098 A1    May 21, 2020

(51) Int. Cl.
*H01J 37/32*    (2006.01)
*H01L 21/687*    (2006.01)

(52) U.S. Cl.
CPC ...... *H01J 37/32642* (2013.01); *H01J 37/321* (2013.01); *H01J 37/32715* (2013.01); *H01L 21/68735* (2013.01); *H01J 2237/04924* (2013.01); *H01J 2237/1202* (2013.01); *H01J 2237/3344* (2013.01)

(58) Field of Classification Search
USPC ................ 118/728–730; 156/345.51–345.55; 361/234
See application file for complete search history.

(56) References Cited

U.S. PATENT DOCUMENTS 5,267,607 A    12/1993 Wada
5,660,673 A    8/1997 Miyoshi
(Continued)

FOREIGN PATENT DOCUMENTS

CN    105336561 A    2/2016
CN    105789010 A    7/2016
(Continued)

OTHER PUBLICATIONS

International Search Report and Written Opinion dated Apr. 24, 2017 for Application No. PCT/US2016/069449.
(Continued)

*Primary Examiner* — Rakesh K Dhingra
(74) *Attorney, Agent, or Firm* — Patterson + Sheridan, LLP

(57) ABSTRACT

The present disclosure relates to an apparatus and method that manipulates the voltage at an edge ring relative to a substrate located on a substrate support located within a processing chamber. The apparatus includes a substrate support assembly that has a body having a substrate electrode embedded therein for applying a voltage to a substrate. The body of the substrate support assembly additionally has an edge ring electrode embedded therein for applying a voltage to an edge ring. The apparatus further includes an edge ring voltage control circuit coupled to the edge ring electrode. A substrate voltage control circuit is coupled to the substrate electrode. The edge ring voltage control circuit and the substrate voltage control circuit are independently tunable to generate a difference in voltage between the edge ring voltage and the substrate voltage.

14 Claims, 10 Drawing Sheets

(56) References Cited

U.S. PATENT DOCUMENTS

| | | |
|---|---|---|
| 5,730,801 A | 3/1998 | Tepman et al. |
| 5,762,714 A | 6/1998 | Mohn et al. |
| 5,851,140 A | 12/1998 | Barns et al. |
| 5,885,428 A | 3/1999 | Kogan |
| 6,022,809 A | 2/2000 | Fan |
| 6,044,534 A | 4/2000 | Seo et al. |
| 6,206,976 B1 | 3/2001 | Crevasse et al. |
| 6,375,748 B1 | 4/2002 | Yudovsky et al. |
| 6,391,787 B1 | 5/2002 | Dhindsa et al. |
| 6,511,543 B1 | 1/2003 | Stauss et al. |
| 6,589,352 B1 | 7/2003 | Yudovsky et al. |
| 6,676,759 B1 | 1/2004 | Takagi |
| 6,709,547 B1 | 3/2004 | Ni et al. |
| 6,744,212 B2 | 6/2004 | Fischer et al. |
| 6,773,562 B1 | 8/2004 | Inagawa et al. |
| 6,896,765 B2 | 5/2005 | Steger |
| 6,898,558 B2 | 5/2005 | Klekotka |
| 7,138,014 B2 | 11/2006 | Stevens et al. |
| 7,138,067 B2 | 11/2006 | Vahedi et al. |
| 7,176,403 B2 | 2/2007 | Steger |
| 7,252,738 B2 | 8/2007 | Tong et al. |
| 7,311,784 B2 | 12/2007 | Fink |
| 7,338,578 B2 | 3/2008 | Huang et al. |
| 7,589,950 B2 | 9/2009 | Parkhe et al. |
| 7,824,146 B2 | 11/2010 | Lanee et al. |
| 7,968,469 B2 | 6/2011 | Collins et al. |
| 8,270,141 B2 | 9/2012 | Willwerth et al. |
| 8,298,371 B2 | 10/2012 | Koshimizu et al. |
| 8,441,640 B2 | 5/2013 | Patalay et al. |
| 8,696,878 B2 | 4/2014 | Riker et al. |
| 8,900,398 B2 | 12/2014 | Dhindsa et al. |
| 8,933,628 B2 | 1/2015 | Banna et al. |
| 8,988,848 B2 | 3/2015 | Todorow et al. |
| 8,999,106 B2 | 4/2015 | Liu et al. |
| 9,011,637 B2 | 4/2015 | Yamamoto |
| 9,017,526 B2 | 4/2015 | Singh et al. |
| 9,076,636 B2 | 7/2015 | Ohata et al. |
| 9,142,391 B2 | 9/2015 | Yamamoto |
| 9,287,093 B2 | 3/2016 | Singh et al. |
| 9,410,249 B2 | 8/2016 | Male et al. |
| 9,536,711 B2* | 1/2017 | Dhindsa ............ H01J 37/32642 |
| 9,583,357 B1 | 2/2017 | Long et al. |
| 9,601,319 B1 | 3/2017 | Bravo et al. |
| 9,620,376 B2 | 4/2017 | Kamp et al. |
| 9,761,459 B2 | 9/2017 | Long et al. |
| 9,852,889 B1 | 12/2017 | Kellogg et al. |
| 9,881,820 B2 | 1/2018 | Wong et al. |
| 9,947,517 B1 | 4/2018 | Luere et al. |
| 10,103,010 B2 | 10/2018 | Luere et al. |
| 10,504,702 B2 | 12/2019 | Luere et al. |
| 10,553,404 B2 | 2/2020 | Luere et al. |
| 10,600,623 B2 | 3/2020 | Sarode Vishwanath |
| 10,790,123 B2 | 9/2020 | Sarode Vishwanath |
| 10,991,556 B2 | 4/2021 | Luere et al. |
| 2003/0173031 A1 | 9/2003 | Aggarwal et al. |
| 2003/0201069 A1 | 10/2003 | Johnson |
| 2003/0219989 A1* | 11/2003 | Terasaki ............ H01J 37/321 438/725 |
| 2004/0053428 A1 | 3/2004 | Steger |
| 2004/0149389 A1 | 8/2004 | Fink |
| 2004/0261946 A1 | 12/2004 | Endoh et al. |
| 2005/0061447 A1 | 3/2005 | Kim et al. |
| 2005/0133164 A1 | 6/2005 | Fischer et al. |
| 2005/0263070 A1 | 12/2005 | Fink |
| 2007/0131253 A1* | 6/2007 | Nakamura ............ B08B 7/00 134/22.1 |
| 2008/0066868 A1 | 3/2008 | Masuda |
| 2008/0173237 A1 | 7/2008 | Collins et al. |
| 2008/0236749 A1 | 10/2008 | Koshimizu et al. |
| 2008/0289766 A1 | 11/2008 | Heemstra et al. |
| 2009/0041568 A1 | 2/2009 | Muraoka et al. |
| 2009/0067954 A1 | 3/2009 | Lanee et al. |
| 2009/0242134 A1* | 10/2009 | Iwata ............ H01J 37/32091 156/345.48 |
| 2010/0101729 A1 | 4/2010 | Kim et al. |
| 2010/0196625 A1 | 8/2010 | Yoon et al. |
| 2010/0206484 A1 | 8/2010 | Hiromi et al. |
| 2011/0011534 A1* | 1/2011 | Dhindsa ............ H01J 37/32091 156/345.43 |
| 2011/0031111 A1 | 2/2011 | Kobayashi |
| 2011/0157760 A1 | 6/2011 | Willwerth et al. |
| 2011/0240221 A1* | 10/2011 | Yamamoto ........ H01J 37/32091 156/345.28 |
| 2011/0287631 A1 | 11/2011 | Yamamoto |
| 2012/0052599 A1 | 3/2012 | Brouk et al. |
| 2012/0091108 A1 | 4/2012 | Lin et al. |
| 2012/0176692 A1 | 7/2012 | Yamawaku et al. |
| 2012/0256363 A1 | 10/2012 | Okita et al. |
| 2012/0305184 A1 | 12/2012 | Singh et al. |
| 2013/0093443 A1 | 4/2013 | Patrick |
| 2013/0106286 A1 | 5/2013 | Banna et al. |
| 2013/0155568 A1 | 6/2013 | Todorow et al. |
| 2014/0017900 A1 | 1/2014 | Doba et al. |
| 2014/0213055 A1 | 7/2014 | Himori et al. |
| 2014/0265089 A1 | 9/2014 | Tantiwong et al. |
| 2015/0064809 A1 | 3/2015 | Lubomirsky |
| 2015/0181684 A1 | 6/2015 | Banna et al. |
| 2015/0200124 A1 | 7/2015 | Yamamoto |
| 2015/0325413 A1* | 11/2015 | Kim ............ H01J 37/32706 315/111.21 |
| 2015/0332951 A1 | 11/2015 | Male et al. |
| 2016/0042926 A1 | 2/2016 | Ishikawa et al. |
| 2016/0056017 A1 | 2/2016 | Kim et al. |
| 2016/0189994 A1* | 6/2016 | Sasaki ............ H01L 21/67109 361/234 |
| 2016/0211165 A1 | 7/2016 | McChesney et al. |
| 2016/0211166 A1 | 7/2016 | Yan et al. |
| 2016/0240415 A1 | 8/2016 | Sekiya |
| 2017/0018411 A1 | 1/2017 | Sriraman et al. |
| 2017/0069462 A1 | 3/2017 | Kanarik et al. |
| 2017/0103870 A1 | 4/2017 | Marakhtanov et al. |
| 2017/0110335 A1 | 4/2017 | Yang et al. |
| 2017/0113355 A1 | 4/2017 | Genetti et al. |
| 2017/0115657 A1 | 4/2017 | Trussell et al. |
| 2017/0117170 A1 | 4/2017 | Wong et al. |
| 2017/0117172 A1 | 4/2017 | Genetti et al. |
| 2017/0133283 A1 | 5/2017 | Kenworthy |
| 2017/0178917 A1 | 6/2017 | Kamp et al. |
| 2017/0213758 A1 | 7/2017 | Rice et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0250056 A1 | 8/2017 | Boswell et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0316935 A1 | 11/2017 | Tan et al. |
| 2017/0330786 A1 | 11/2017 | Genetti et al. |
| 2017/0334074 A1 | 11/2017 | Genetti et al. |
| 2017/0372912 A1 | 12/2017 | Long et al. |
| 2018/0019107 A1 | 1/2018 | Ishizawa |
| 2018/0025891 A1* | 1/2018 | Marakhtanov ...... H01J 37/3299 438/714 |
| 2018/0052104 A1 | 2/2018 | Larsson et al. |
| 2018/0061696 A1 | 3/2018 | D'Ambra et al. |
| 2018/0090354 A1 | 3/2018 | Sugita et al. |
| 2018/0166259 A1 | 6/2018 | Ueda |
| 2018/0204757 A1* | 7/2018 | Fushimi ............ H01J 37/32174 |
| 2018/0218933 A1 | 8/2018 | Luere et al. |
| 2018/0233328 A1 | 8/2018 | Ueda et al. |
| 2018/0277416 A1 | 9/2018 | Takahashi et al. |
| 2018/0301322 A1 | 10/2018 | Sugita et al. |
| 2018/0308737 A1 | 10/2018 | Moriya et al. |
| 2018/0315583 A1 | 11/2018 | Luere et al. |
| 2018/0315640 A1 | 11/2018 | Ueda et al. |
| 2019/0013232 A1 | 1/2019 | Yan et al. |
| 2019/0088531 A1 | 3/2019 | Sarode Vishwanath et al. |
| 2019/0131115 A1* | 5/2019 | Gu ............ H01L 21/68735 |
| 2019/0172688 A1 | 6/2019 | Ueda |
| 2019/0172714 A1 | 6/2019 | Bobek et al. |
| 2019/0318918 A1* | 10/2019 | Saitoh ............ H01J 37/3244 |
| 2019/0333785 A1 | 10/2019 | Tanikawa |
| 2019/0362949 A1 | 11/2019 | Sarode Vishwanath |

(56) References Cited

U.S. PATENT DOCUMENTS

| | | | |
|---|---|---|---|
| 2020/0020510 A1 | 1/2020 | Shoeb et al. | |
| 2020/0135527 A1* | 4/2020 | Sung | H01J 37/00 |
| 2020/0234981 A1 | 7/2020 | Schmid et al. | |

FOREIGN PATENT DOCUMENTS

| | | |
|---|---|---|
| JP | 2000049144 A | 2/2000 |
| JP | 3020898 B2 | 3/2000 |
| JP | 2001230239 A | 8/2001 |
| JP | 2002176030 A | 6/2002 |
| JP | 2006186171 A | 7/2006 |
| JP | 2008078208 A | 4/2008 |
| JP | 2011054933 A | 3/2011 |
| JP | 2013511847 A | 4/2013 |
| JP | 2015050156 A | 3/2015 |
| KR | 20060117537 A | 11/2006 |
| KR | 100980972 B1 | 9/2010 |
| TW | 439093 B | 6/2001 |
| TW | 201243942 A | 11/2012 |
| TW | 201324674 A | 6/2013 |
| TW | 201526101 A | 7/2015 |
| TW | M587362 U | 12/2019 |
| WO | 2008005756 A2 | 1/2008 |
| WO | 20170103870 A1 | 6/2017 |

OTHER PUBLICATIONS

"Bracelet Holder Vise Clamp Stone Prong Pave Channel Setting Setter." PROLINEMAX, www.prolinemax.com/BRACELET-HOLDER-VISE-Clamp-Stone-Prong-Pave-Channel-Setting-Setter-_p_1006.html.

Taiwan Office Action dated Sep. 20, 2019 for Application No. 106100104.

PCT Notification of Transmittal of the International Search Report and the Written Opinion of the International Searching Authority for International Application No. PCT/US2019/051771; dated Mar. 24, 2020; 11 total pages.

Japanese Office Action for Application No. JP 2019-111014 dated Aug. 25, 2020.

International Search Report and Written Opinion for PCT/US2020/016242 dated Jul. 14, 2020.

Japanese Office Action dated Oct. 27, 2020 for Application No. 2018-522911.

Korean Office Action in related application 10-2019-0069336 dated Nov. 11, 2020.

Notice of Allowance in related application KR10-2019-0069336 dated May 9, 2021.

Office Action in related application TW108120460 dated Jan. 26, 2021.

* cited by examiner

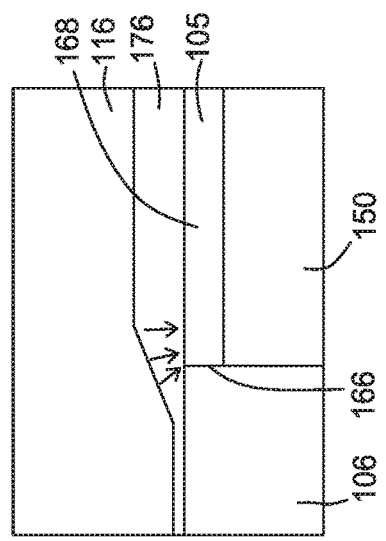
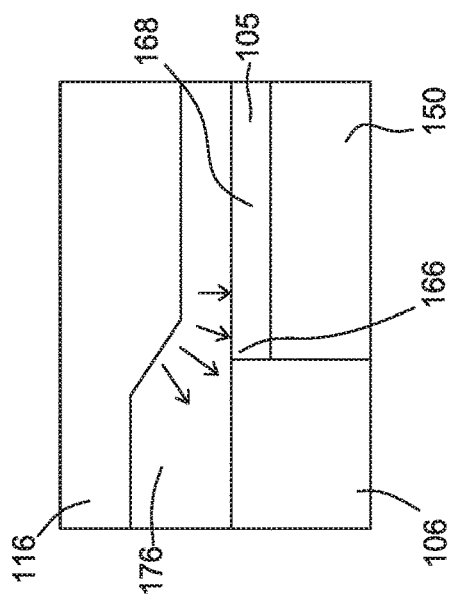
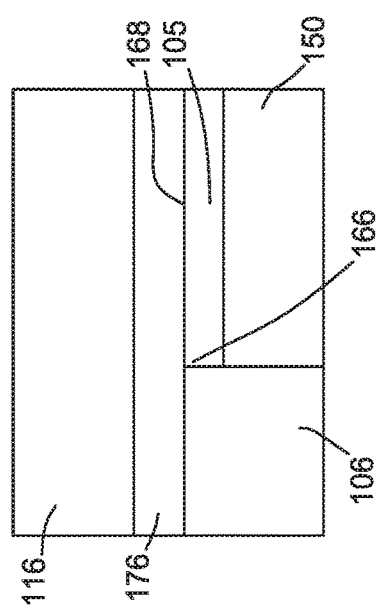

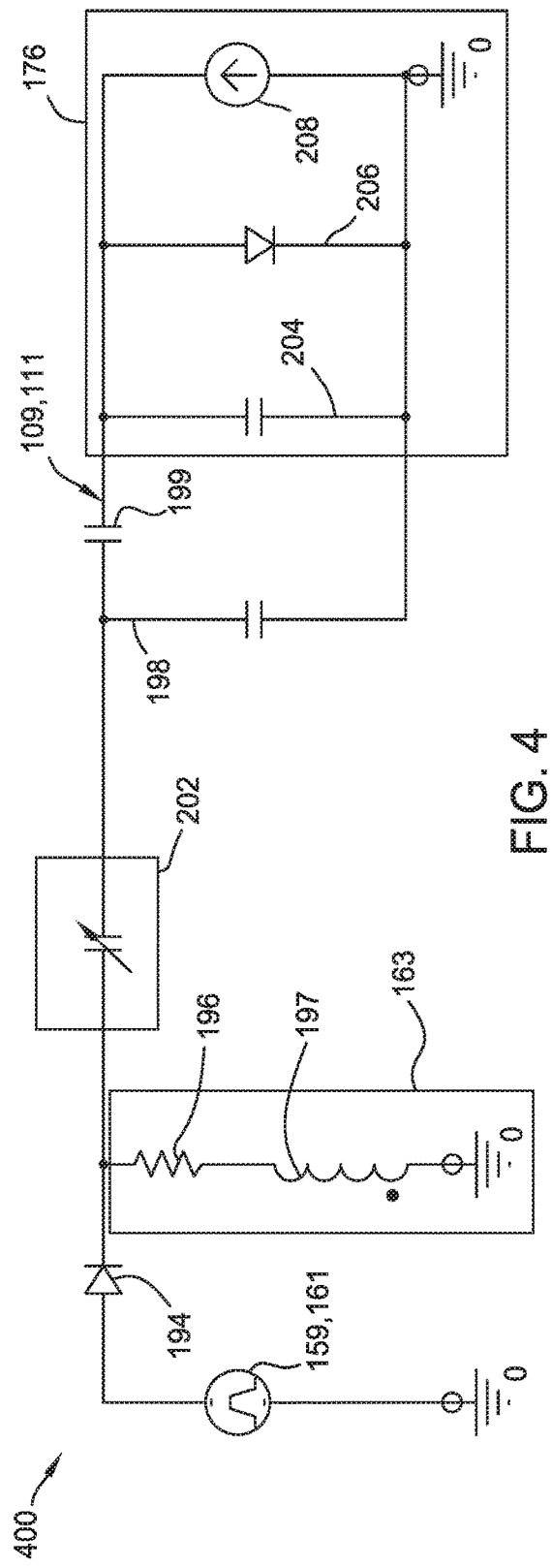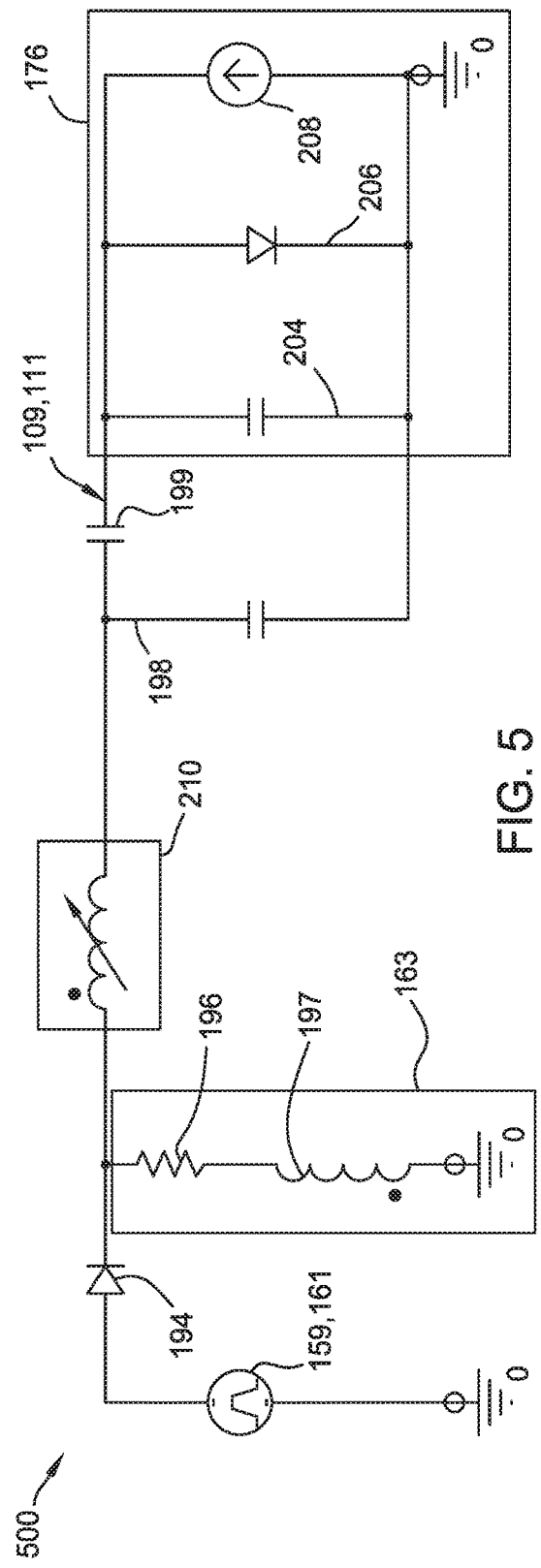

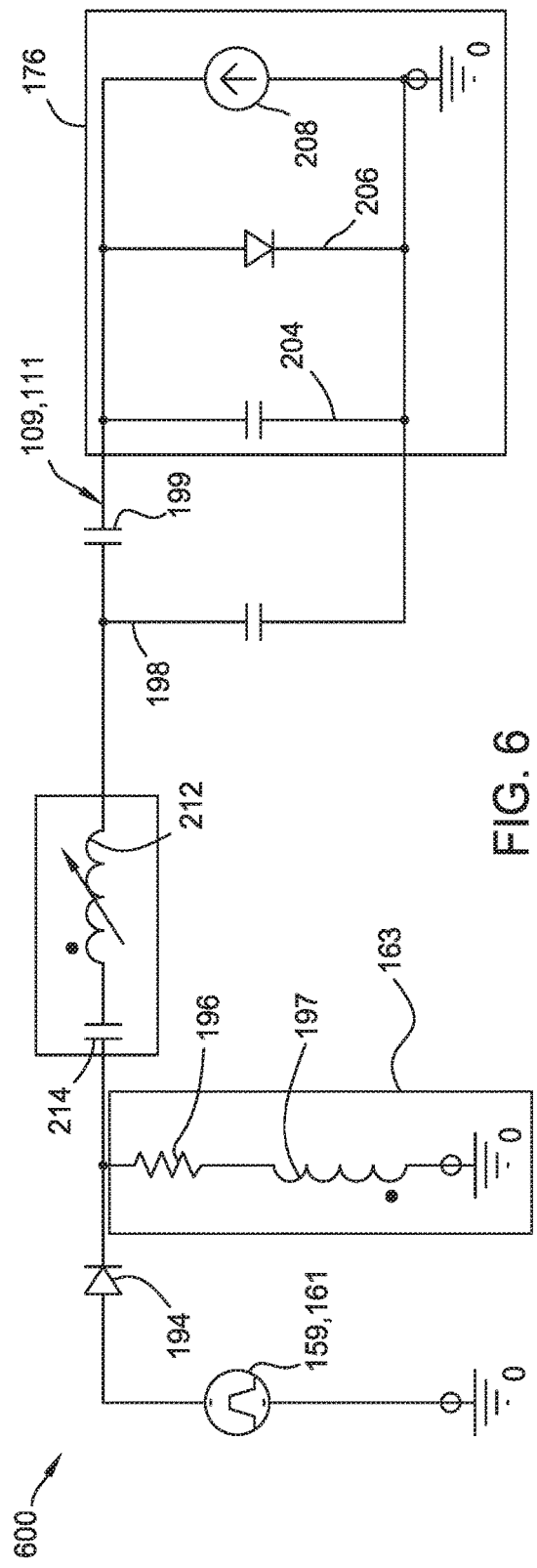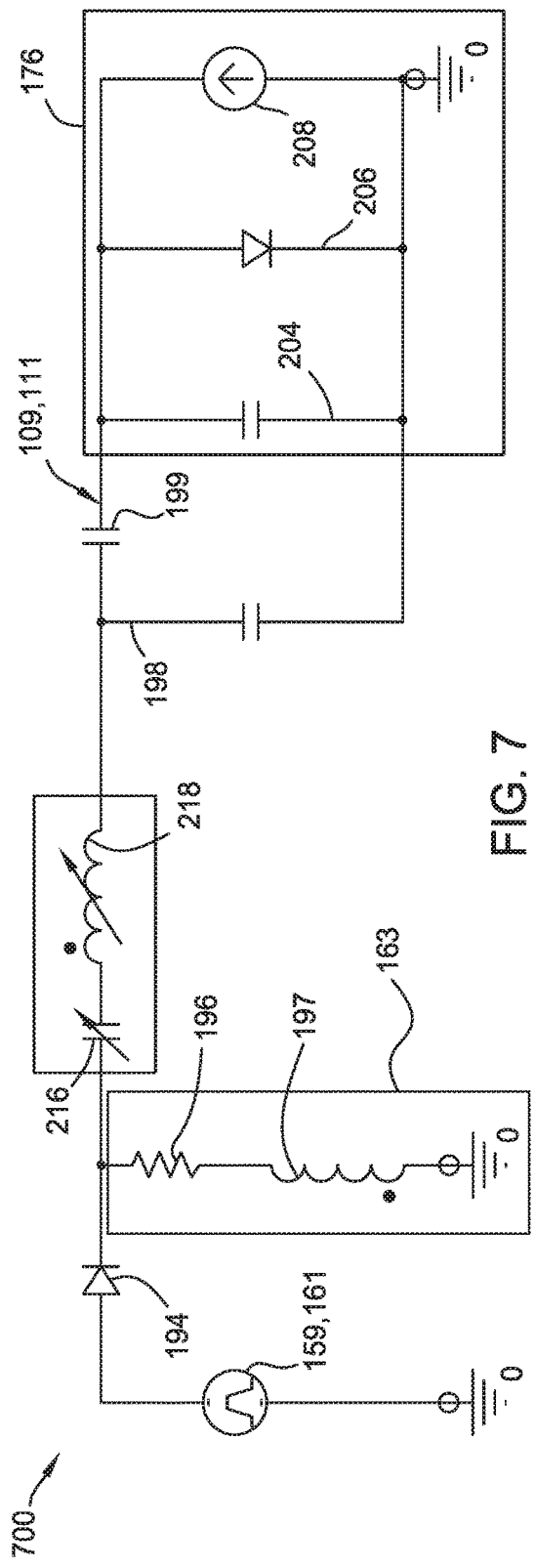
FIG. 6
FIG. 7

CIRCUITS FOR EDGE RING CONTROL IN SHAPED DC PULSED PLASMA PROCESS DEVICE

BACKGROUND

Field

Examples of the present disclosure generally relate to a substrate support for a plasma processing chamber, and more particularly, to an apparatus and methods for varying voltages applied to an edge ring portion of the substrate support relative to a substrate support portion of the substrate support to control the plasma sheath in the plasma processing chamber.

Description of the Related Art

As semiconductor technology nodes advanced with reduced size device geometries, substrate edge critical dimension uniformity requirements become more stringent and affect die yields. Commercial plasma reactors include multiple tunable knobs for controlling process uniformity across a substrate, such as, for example, temperature, gas flow, RF power, and the like.

During processing, a substrate disposed on a substrate support may undergo a process that deposits material on the substrate and to remove, or etch, portions of the material from the substrate, often in succession or in alternating processes. It is typically beneficial to have uniform deposition and etching rates across the surface of the substrate. However, process non-uniformities often exist across the surface of the substrate and may be significant at the perimeter or edge of the substrate. The etch profile at an extreme edge of the substrate may deviate from that at the center of the substrate due to different ion density, RF uniformity, or previous processing. These non-uniformities at the perimeter may be attributable to electric field termination affects and are sometimes referred to as edge effects. These edge effects reduce usable die yield near the edge of the substrate.

One technique in the art for obtaining better uniformity is to tune the voltage applied to an edge ring disposed on the substrate support to change the ion density at the substrate edge. This provides a control knob to control the extreme edge process profile and feature tilting. This may be accomplished by applying a first RF voltage to an edge ring electrode embedded in the edge ring and a second RF voltage to a substrate support electrode embedded in the substrate support. However, employing multiple RF source voltages is expensive. Other methods and apparatus for controlling a plasma sheath exist, such as edge rings which are movable relative to the substrate support. However, certain electronic device manufacturing processes are subject to stringent particle requirements which make moving parts undesirable. Movable edge rings are also subjectable to arcing.

Therefore, there is a need for apparatus and methods that improve process uniformity on a substrate.

SUMMARY

The present disclosure provides apparatus and methods for manipulating the voltage at the edge ring relative to a substrate located on a substrate support, which functions as an effective tuning knob to control the process profile near a substrate edge. Manipulating the edge ring's voltage can improve the process uniformity on the substrate. Also, controlling the edge ring's voltage can assist in controlling the verticality (i.e., tilting) of features formed near the substrate edge.

In one example, the apparatus includes a substrate support assembly that has a body having a substrate support portion having a substrate electrode embedded therein for applying a substrate voltage to a substrate. The body of the substrate support assembly further has an edge ring portion disposed adjacent to the substrate support portion. The edge ring portion has an edge ring electrode embedded therein for applying an edge ring voltage to an edge ring. The apparatus further includes an edge ring voltage control circuit coupled to the edge ring electrode. A substrate voltage control circuit is coupled to the substrate electrode. The edge ring voltage control circuit and the substrate voltage control circuit are independently tunable to generate a difference in voltage between the edge ring voltage and the substrate voltage.

In another example, the apparatus includes a process chamber that includes a chamber body, a lid disposed on the chamber body, an inductively coupled plasma apparatus positioned above the lid, and a substrate support assembly positioned within the chamber body. The substrate support assembly has a body having a substrate support portion having a substrate electrode embedded therein for applying a substrate voltage to a substrate. The body of the substrate support assembly further has an edge ring portion disposed adjacent to the substrate support portion. The edge ring portion has an edge ring electrode embedded therein for applying an edge ring voltage to an edge ring. The apparatus further includes an edge ring voltage control circuit coupled to the edge ring electrode. A substrate voltage control circuit is coupled to the substrate electrode. The edge ring voltage control circuit and the substrate voltage control circuit are independently tunable to generate a difference in voltage between the edge ring voltage and the substrate voltage.

In another example, a method of operating a process chamber is disclosed. The process chamber comprises a chamber body and a substrate support assembly positioned within the chamber body, the substrate support assembly having a body, the body having a substrate support portion having a substrate electrode embedded therein and an edge ring portion disposed adjacent to the substrate support portion, the edge ring portion having an edge ring electrode embedded therein. The method comprises applying a substrate voltage to the substrate electrode by a substrate voltage control circuit. The method further comprises applying an edge ring voltage to the edge ring electrode by an edge ring voltage control circuit. The method further comprises independently tuning the edge ring voltage control circuit and the substrate voltage control circuit to change a ratio between the edge ring voltage and the substrate voltage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 2A-2C are schematic views of a plasma sheath relative to the edge of a substrate, according to examples of the disclosure.

FIG. 4 is schematic circuit diagram illustrating one embodiment of the edge ring voltage control circuit/substrate voltage control circuit for driving the electrodes of the substrate support assembly.

FIG. 5 is schematic circuit diagram illustrating another embodiment of the edge ring voltage control circuit/substrate voltage control circuit for driving the electrodes of the substrate support assembly.

FIG. 6 is schematic circuit diagram illustrating another embodiment of the edge ring voltage control circuit/substrate voltage control circuit for driving the electrodes of the substrate support assembly.

FIG. 7 is schematic circuit diagram illustrating another embodiment of the edge ring voltage control circuit/substrate voltage control circuit for driving the electrodes of the substrate support assembly.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to apparatus and methods that apply a voltage difference between a substrate support portion and an edge ring support portion of a substrate support assembly. The substrate support assembly has a body having the substrate support portion having a substrate electrode embedded therein for applying a substrate voltage to a center portion of a substrate. The body of the substrate support assembly further has the edge ring portion disposed adjacent to the substrate support portion. The edge ring portion has an edge ring electrode embedded therein for applying an edge ring voltage to the edge portion of the substrate.

The apparatus and methods further include an edge ring voltage control circuit coupled to the edge ring electrode. A substrate voltage control circuit coupled to the substrate electrode. At least one shaped DC pulse voltage source is coupled to one or both of the edge ring voltage control circuit and the substrate voltage control circuit. The edge ring voltage control circuit and the substrate voltage control circuit are independently tunable to generate a difference in voltage between the edge ring voltage and the substrate voltage.

As the plasma sheath becomes non-uniform adjacent the edge ring due to different ion density, RF uniformity, or previous processing, one or both of the edge ring voltage control circuit and the substrate voltage control circuit is adjusted in order to affect the voltage amplitude difference between the substrate and the edge ring. Adjustment of the voltage amplitude difference via tuning one or both of the edge ring voltage control circuit and the substrate voltage control circuit results in an adjustment of the plasma sheath near the substrate perimeter. Bending of the sheath at the perimeter of the substrate will either focus ions (increase etch rate) or de-focus ions (decrease etch rate) in the region of approximately 0 mm-10 mm (depending on the process condition) from the edge of the substrate.

The present disclosure also addresses the need to compensate for extreme edge non-uniformities left by previous process steps. In all of these applications, when the process is very sensitive to particles, for example in logic circuit applications, it is considered a high risk to have moving parts in the vicinity of the substrate. The present disclosure addresses the need for extreme edge voltage tunability with no moving parts.

Figure 1:
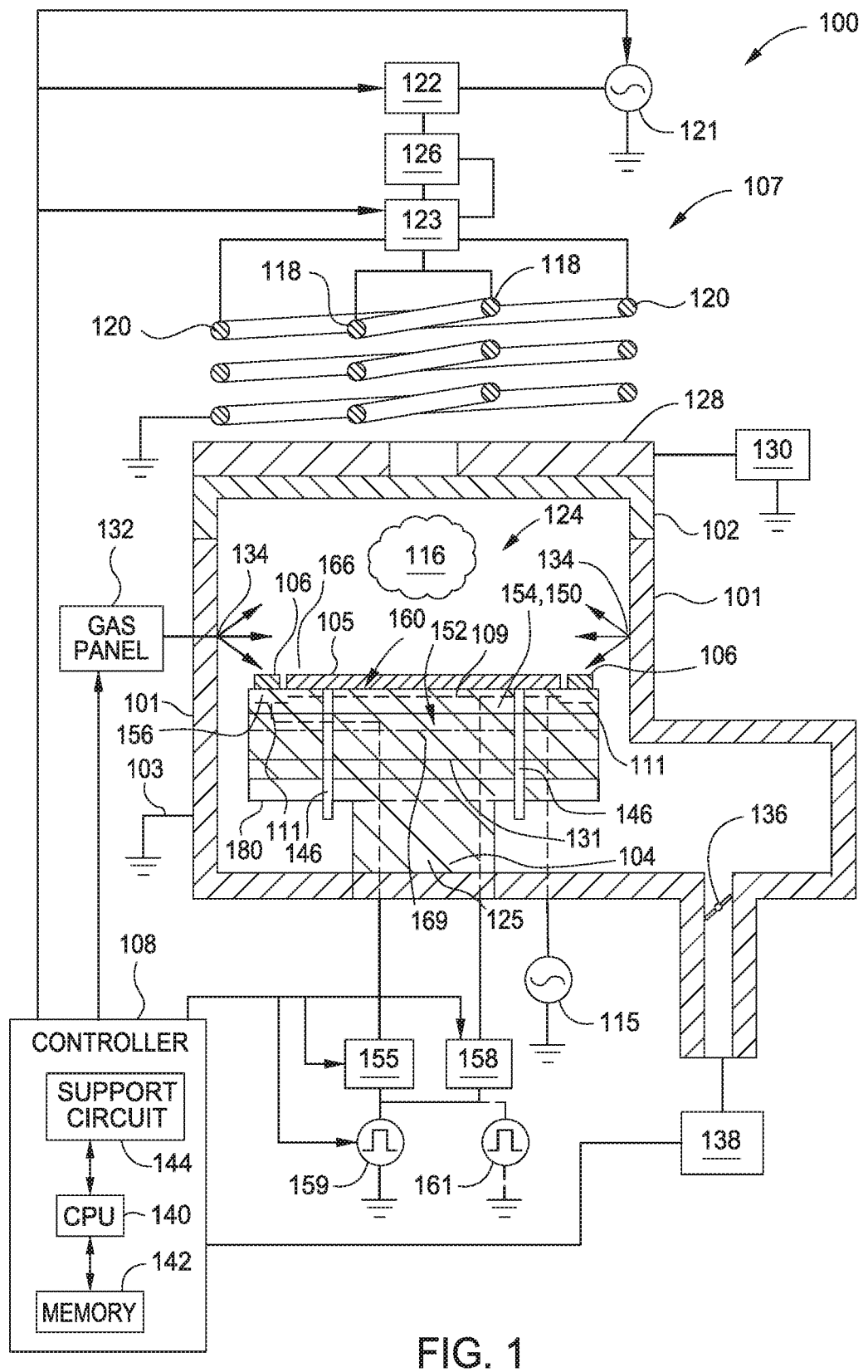
FIG. 1 is a schematic sectional view of a process chamber according to one embodiment of the disclosure.

FIG. 1 is a schematic sectional view of a process chamber 100, according to one example of the disclosure. The process chamber 100 includes a chamber body 101 and a lid 102 disposed thereon that together define an internal volume 124. The chamber body 101 is typically coupled to an electrical ground 103. A substrate support assembly 104 is disposed within the inner volume to support a substrate 105 thereon during processing. An edge ring 106 is positioned on the substrate support assembly 104 and surrounds the periphery of the substrate 105. The process chamber 100 also includes an inductively coupled plasma apparatus 107 for generating a plasma of reactive species within the process chamber 100, and a controller 108 adapted to control systems and subsystems of the process chamber 100.

The substrate support assembly 104 is disposed in the internal volume 124. The substrate support assembly 104 generally includes at least a substrate support 152. The substrate support 152 includes an electrostatic chuck 150 comprising a substrate support portion 154 configured to underlay and support the substrate 105 to be processed and an edge ring portion 156 configured to support an edge ring 106. The substrate support assembly 104 may additionally include a heater assembly 169. The substrate support assembly 104 may also include a cooling base 131. The cooling base 131 may alternately be separate from the substrate support assembly 104. The substrate support assembly 104 may be removably coupled to a support pedestal 125. The support pedestal 125 is mounted to the chamber body 101. The support pedestal 125 may optionally include a facility plate 180. The substrate support assembly 104 may be periodically removed from the support pedestal 125 to allow for refurbishment of one or more components of the substrate support assembly 104. Lifting pins 146 are disposed through the substrate support assembly 104 as conventionally known to facilitate substrate transfer.

The facility plate 180 is configured to accommodate a plurality of fluid connections from the electrostatic chuck 150 and the cooling base 131. The facility plate 180 is also configured to accommodate the plurality of electrical connections from the electrostatic chuck 150 and the heater assembly 169. The myriad of connections may run externally or internally of the substrate support assembly 104, while the facility plate 180 provides an interface for the connections to a respective terminus.

A substrate electrode 109 is embedded within the substrate support portion 154 of the electrostatic chuck 150 for applying a substrate voltage to a substrate 105 disposed on an upper surface 160 of the substrate support assembly 104. The edge ring portion 156 has an edge ring electrode 111 embedded therein for applying an edge ring voltage to the edge ring 106. An edge ring voltage control circuit 155 is coupled to the edge ring electrode 111. A substrate voltage control circuit 158 is coupled to the substrate electrode 109. In one embodiment, a first shaped DC pulse voltage source 159 is coupled to one or both of the edge ring voltage control circuit 155 and the substrate voltage control circuit 158. In another embodiment, the first shaped DC pulse voltage source 159 is coupled to the edge ring voltage control circuit 155 and a second shaped DC pulse voltage source 161 is coupled to the substrate voltage control circuit 158. The edge ring voltage control circuit 155 and the substrate voltage control circuit 158 are independently tunable to generate a difference in voltage between the edge ring voltage and the substrate voltage. The substrate voltage control circuit 158 and the edge ring voltage control circuit 155 each include variable and/or fixed capacitors and/or inductors to provide the independent tunability of the edge ring voltage and the substrate voltage. The substrate electrode 109 is further coupled to a chucking power source 115 to facilitate chucking of the substrate 105 to the upper surface 160 with the electrostatic chuck 150 during processing.

The inductively coupled plasma apparatus 107 is disposed above the lid 102 and is configured to inductively couple RF power to gasses within the process chamber 100 to generate a plasma 116. The inductively coupled plasma apparatus 107 includes first and second coils 118, 120, disposed above the lid 102. The relative position, ratio of diameters of each coil 118, 120, and/or the number of turns in each coil 118, 120 can each be adjusted as desired to control the profile or density of the plasma 116 being formed. Each of the first and second coils 118, 120 is coupled to an RF power supply 121 through a matching network 122 via an RF feed structure 123. The RF power supply 121 may illustratively be capable of producing up to about 4000 W (but not limited to about 4000 W) at a tunable frequency in a range from 50 kHz to 13.56 MHz, although other frequencies and powers may be utilized as desired for particular applications.

In some examples, a power divider 126, such as a dividing capacitor, may be provided between the RF feed structure 123 and the RF power supply 121 to control the relative quantity of RF power provided to the respective first and second coils 118, 120.

In other embodiments, a capacitively coupled plasma apparatus (not shown) can be used above the lid 102.

A heater element 128 may be disposed on the lid 102 to facilitate heating the interior of the process chamber 100. The heater element 128 may be disposed between the lid 102 and the first and second coils 118, 120. In some examples, the heater element 128 may include a resistive heating element and may be coupled to a power supply 130, such as an AC power supply, configured to provide sufficient energy to control the temperature of the heater element 128 within a desired range.

During operation, the substrate 105, such as a semiconductor substrate or other substrate suitable for plasma processing, is placed on the substrate support assembly 104. Substrate lift pins 146 are movably disposed in the substrate support assembly 104 to assist in transfer of the substrate 105 onto the substrate support assembly 104. After positioning of the substrate 105, process gases are supplied from a gas panel 132 through entry ports 134 into the internal volume 124 of the chamber body 101. The process gases are ignited into a plasma 116 in the process chamber 100 by applying power from the RF power supply 121 to the first and second coils 118, 120. The pressure within the internal volume 124 of the process chamber 100 may be controlled using a valve 136 and a vacuum pump 138.

The process chamber 100 includes the controller 108 to control the operation of the process chamber 100 during processing. The controller 108 comprises a central processing unit (CPU) 140, a memory 142, and support circuits 144 for the CPU 140 and facilitates control of the components of the process chamber 100. The controller 108 may be one of any form of general-purpose computer processor that can be used in an industrial setting for controlling various chambers and sub-processors. The memory 142 stores software (source or object code) that may be executed or invoked to control the operation of the process chamber 100 in the manner described herein. The controller 108 is configured to control the first shaped DC pulse voltage source 159, the second shaped DC pulse voltage source 161, the edge ring voltage control circuit 155, and the substrate voltage control circuit 158.

FIGS. 2A-2C are schematic views of a plasma sheath 176 underlying a plasma 116 generated within the process chamber 100 relative to the edge of a substrate 105, according to examples of the disclosure. FIG. 2A illustrates a baseline plasma sheath 176 relative to an edge ring 106 and a substrate 105 overlying the electrostatic chuck 150. When the same voltage is applied to the substrate electrode 109 and edge ring electrode 111, the upper surface of the edge ring 106 and the substrate 105 are generally coplanar and the boundary of the plasma sheath 176 is generally linear and parallel to the substrate 105 as the sheath 176 crosses on an edge portion 166 of the substrate 105. The plasma sheath 176 is substantially parallel with and equally spaced from the upper surfaces of the edge ring 106 and the substrate 105. The profile of the plasma sheath 176 illustrated in FIG. 2A results in uniform center to edge ion density and ion energy towards to the substrate 105, given uniform plasma generated above the substrate 105 and the edge ring 106. In an example, there is no difference in voltage between the substrate 105 and the edge ring 106. This may be referred to as a baseline voltage.

After processing a predetermined number of substrates, the height of the edge ring 106 may be lower, not coplanar with the substrate top any more, resulting in undesired edge effects forming on the edge portion 166 of the substrate 105. In other applications, the nonuniformity of the plasma density, gas concentration, etc. can cause nonuniformity of the processing profile near the edge portion 166 of the substrate 105. In still other applications, previous processes may result in a non-uniform center-to-edge feature profile and it is desired to compensate such uniformity with an edge tuning knob. To combat edge effects, a positive voltage difference or a negative voltage difference is formed between the edge ring 106 and the substrate 105.

As illustrated in FIG. 2B, where a higher voltage is applied to the edge ring electrode 111 compared to that of the substrate electrode 109, the boundary plasma sheath 176 is no longer flat at the interface of the substrate 105 and the edge ring 106 and has different spacings from the surface of the edge ring 106 versus the substrate 105. The profile of the plasma sheath 176 is wider at the edge portion 166 of the substrate 105 relative to the center 168 of the substrate 105. This is indicative of a defocused ion concentration at the edge portion 166 of the substrate 105 relative to the center of the substrate 105. Accordingly, this reduces etch rate at the edge portion 166 of the substrate 105 relative to the center 168 of the substrate 105, and also changes the angle of incidence of ions striking the edge portion 166 of the substrate 105.

FIG. 2C shows how the sheath boundary/height may be controllably changed at the edge of the substrate 105 when a lower voltage is applied to the edge ring electrode 111 compared to the substrate electrode 109. The profile of the plasma sheath 176 is narrower at the edge portion 166 of the substrate 105 relative to the center 168 of the substrate 105. Accordingly, ions are focused to the edge portion 166 of the substrate 105. Accordingly, this increases the etch rate at the edge portion 166 of the substrate 105 and also changes the angle of incidence of ions striking the edge portion 166 of the substrate 105.

Figure 3B:
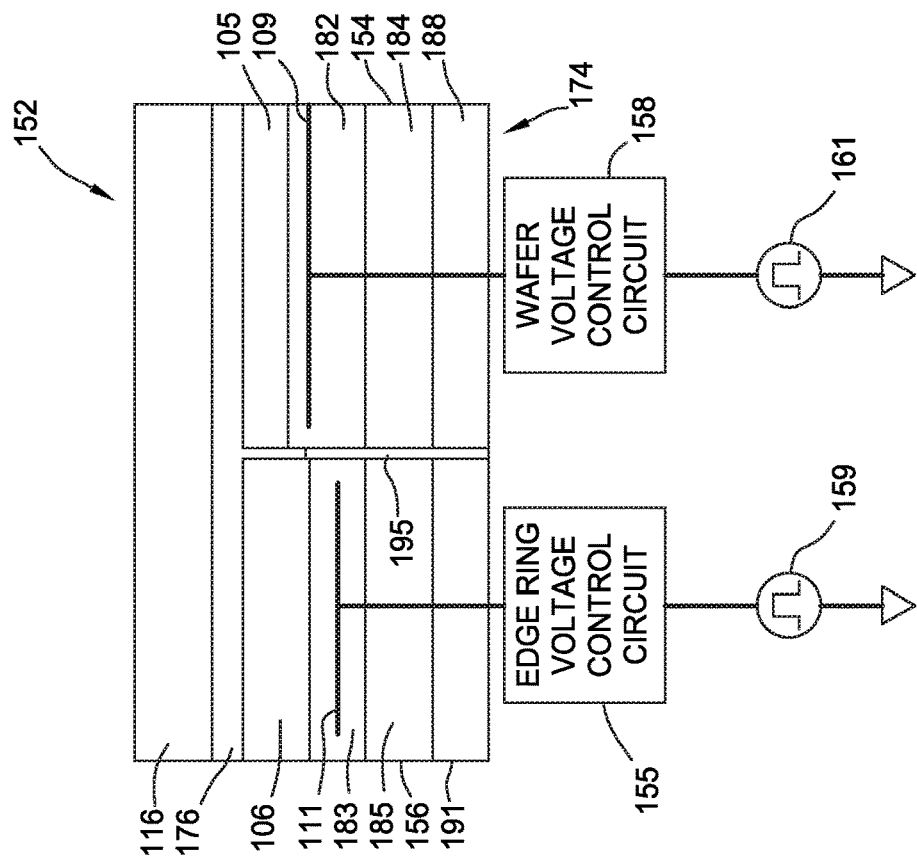
FIGS. 3A and 3B illustrate enlarged schematic views of the substrate support shown in FIG. 1.
Figure 3A:
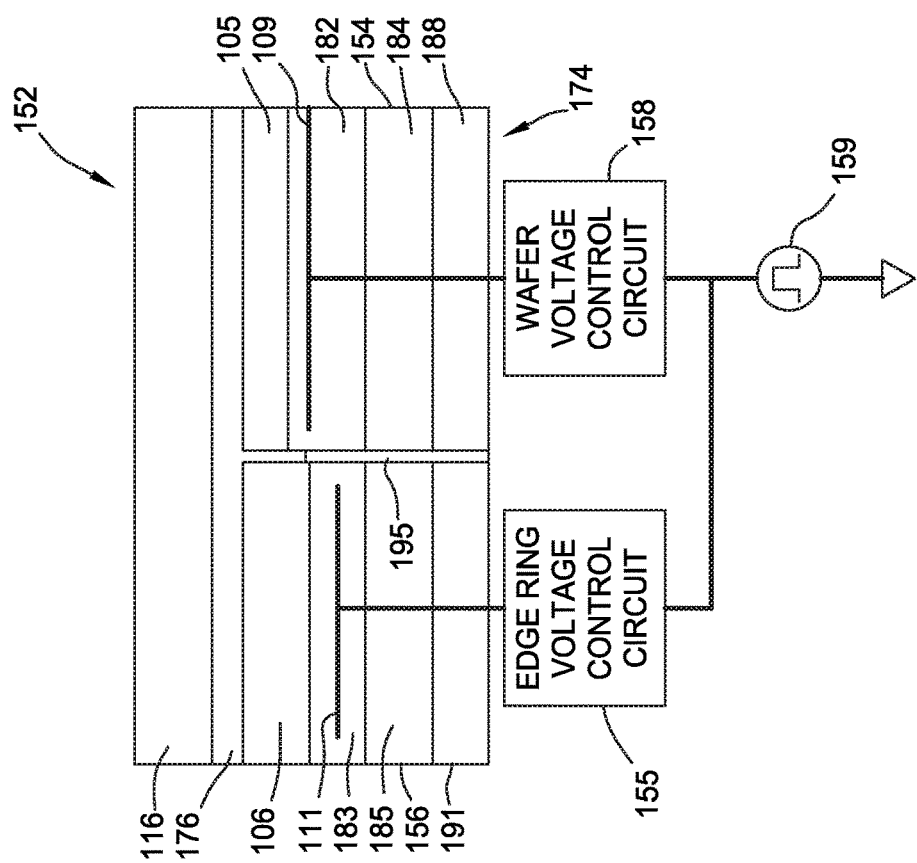

FIGS. 3A and 3B illustrate enlarged schematic views of the substrate support 152 shown in FIG. 1. The substrate support 152 has a body 174. The body 174 includes a substrate support portion 154 and an edge ring portion 156. The substrate support portion 154 includes a first isolation layer 182, an optional second isolation layer 184, and a first cathode 188. The first isolation layer 182 of the substrate support portion 154 may be made of a ceramic. The first isolation layer 182 of the substrate support portion 154 may have the substrate electrode 109 embedded therein for applying a substrate voltage a substrate 105. The optional second isolation layer 184 underlays the first isolation layer 182 and be made of a ceramic to improve the thermal and electrical isolation of the substrate electrode 109 from other conductive components in the substrate support 152. The first cathode 188 may underlay one or both of the first isolation layer 182 and the second isolation layer 184 of the substrate support portion 154.

The edge ring portion 156 is disposed adjacent to the substrate support portion 154. The edge ring portion 156 may support the edge ring 106. The edge ring portion 156 may include a first isolation layer 183, an optional second isolation layer 185, and a second cathode 191. The first isolation layer has an edge ring electrode 111 embedded therein for applying an edge ring voltage to the edge ring 106. The first isolation layer 183 may be made of a ceramic. The optional second isolation layer 185 underlays the first isolation layer 183 made of a ceramic to improve the thermal and electrical isolation of the edge ring electrode 111 from other conductive components in the substrate support 152. The second cathode 191 may underlay one or both of the first isolation layer 183 and the second isolation layer 185 of the edge ring portion 156. A low-k dielectric cylindrical layer 195 may laterally separate the edge ring portion 156 from the substrate support portion 154 completely or partially. In the embodiments of partial separation of the edge ring portion 156 from the substrate support portion 154, the first cathode 188 and the second cathode 191 may be one piece, and/or the second isolation layer 184 under the substrate 105 and that under the edge ring 106 may be one piece.

A first contact of an edge ring voltage control circuit 155 is electrically coupled to the edge ring electrode 111. A first contact of a substrate voltage control circuit 158 is electrically coupled to the substrate electrode 109. The edge ring voltage control circuit 155 may be either incorporated into the substrate support assembly 104, be external to the substrate support assembly 104 but internal to the process chamber 100 or may be entirely external to the process chamber 100.

In one embodiment, a second contact of both the edge ring voltage control circuit 155 and the substrate voltage control circuit 158 may be coupled together to a first shaped DC pulse voltage source 159. In another embodiment, the second contact of the edge ring voltage control circuit 155 is not tied to the second contact of the substrate voltage control circuit 158, but the second contact of the edge ring voltage control circuit 155 is individually coupled to the first shaped DC pulse voltage source 159 while the second contact of the substrate voltage control circuit 158 is coupled to the second shaped DC pulse voltage source 161. In either configuration of one or two shaped DC pulse voltage sources, the edge ring voltage control circuit 155 and the substrate voltage control circuit 158 are independently tunable to generate a difference in voltage between the edge ring voltage and the substrate voltage.

In one embodiment, the edge ring voltage control circuit 155 and the substrate voltage control circuit 158 are identical circuits. In another embodiment, the edge ring voltage control circuit 155 and the substrate voltage control circuit 158 differ from each other. In an embodiment, at least one of the edge ring voltage control circuit 155 and the substrate voltage control circuit 158 comprises at least one variable passive component to provide tunability of the voltage applied to either the edge ring electrode 111 and/or the substrate electrode 109.

FIG. 4 is schematic circuit diagram illustrating one embodiment of the edge ring voltage control circuit/substrate voltage control circuit 400 for driving the electrodes 109, 111 of the substrate support assembly 104. The first or second shaped DC pulse voltage source 159, 161 is coupled between ground and a forward biasing diode 194. The forward-biased diode 194 is connected to a current returning path 163 comprising a resistor 196 coupled in series with an inductor 197 to ground. A capacitance 199 may exist between the stray capacitance 198 and the plasma sheath 176. A variable capacitor 202 is coupled to the forward biasing diode 194 and to either the edge ring electrode 111 or the substrate electrode 109. The variable capacitor 202 is also coupled to stray capacitance 198. The plasma sheath 176 may be modeled (plasma model 176) as a circuit comprising a capacitor 204 coupled in parallel with a diode 206 and a current source 208 coupled to ground and the variable capacitor 202.

Voltage can be measured at the edge ring electrode 111 and the substrate electrode 109. Using the measured voltage, the controller 108 determines a voltage ratio of edge ring electrode 111 to the substrate electrode 109. Based on the measured results, the variable capacitor 202 in either or both of the edge ring voltage control circuit 155 or the substrate voltage control circuit 158 can be adjusted to manipulate voltage applied to the edge ring electrode 111, which affects the voltage developed at the edge ring 106 and/or the substrate electrode 109 at the substrate 105. Consequently, the height of the plasma sheath 176 above the edge ring 106 and the substrate 105 can be shaped. The edge ring 106 or substrate voltage waveform amplitude can vary between almost zero to full shaped DC pulse input voltage by varying the variable capacitor 202.

FIG. 5 is schematic circuit diagram illustrating another embodiment of the edge ring voltage control circuit/substrate voltage control circuit 500 that can be used to drive the electrodes 109, 111 of the substrate support assembly 104. The first or second shaped DC pulse voltage source 159, 161 is coupled between ground and the forward biasing diode 194, which is coupled to the to a current returning path 163 comprising of a resistor 196 coupled in series with an inductor 197 to ground. In an embodiment, a variable inductor 210 is coupled to the forward biasing diode 194 and to either the edge ring electrode 111 or the substrate electrode 109. The variable inductor 210 is also coupled to stray capacitance 198.

As stated above, voltage can be measured at the edge ring electrode 111 and the substrate electrode 109. Using the measured voltage, the controller 108 determines a voltage ratio of edge ring electrode 111 to the substrate electrode 109. Based on the measured results, the variable inductor 210 in either or both of the edge ring voltage control circuit 155 or the substrate voltage control circuit 158 can be adjusted to manipulate voltage applied to the edge ring electrode 111, which affects the voltage developed at the edge ring 106 and/or the substrate electrode 109 at the substrate 105. Consequently, the height of the plasma sheath 176 above the edge ring 106 and the substrate 105 can be changed. The edge ring or substrate voltage waveform amplitude can vary between almost zero to full shaped DC pulse input voltage by varying the variable inductor 210.

FIG. 6 is schematic circuit diagram illustrating another embodiment of the edge ring voltage control circuit/substrate voltage control circuit 600 for driving the electrodes 109, 111 of the substrate support assembly 104. The first or second shaped DC pulse voltage source 159, 161 is coupled between ground and the forward biasing diode 194, which is coupled to the to a current returning path 163 comprising a resistor 196 coupled in series with an inductor 197 to ground. One terminal of a variable inductor 212 is coupled in series with a fixed capacitor 214, which is coupled to the forward biasing diode 194. The other terminal of the variable inductor 212 is coupled to either the edge ring electrode 111 or the substrate electrode 109. The variable inductor 212 is also coupled to stray capacitance 198.

As stated above, voltage can be measured at the edge ring electrode 111 and the substrate electrode 109. Using the measured voltage, the controller 108 determines a voltage ratio of edge ring electrode 111 to the substrate electrode 109. Based on the measured results, the variable inductor 212 in either or both of the edge ring voltage control circuit 155 or the substrate voltage control circuit 158 can be adjusted to manipulate voltage applied to the edge ring electrode 111, which affects the voltage developed at the edge ring 106 and/or the substrate electrode 109 at the substrate 105. Consequently, the height of the plasma sheath 176 above the edge ring 106 and the substrate 105 can be shaped. The edge ring or substrate voltage waveform amplitude can vary between almost zero to full shaped DC pulse input voltage by varying the variable inductor 212.

FIG. 7 is schematic circuit diagram illustrating another embodiment of the edge ring voltage control circuit/substrate voltage control circuit 700 for driving the electrodes 109, 111 of the substrate support assembly 104. The first or second shaped DC pulse voltage source 159, 161 is coupled between ground and the forward biasing diode 194, which is coupled to the to a current returning path 163 comprising a resistor 196 coupled in series with an inductor 197 to ground. A variable capacitor 216 is coupled in series with a variable inductor 218. The variable capacitor 216 is also coupled to the forward biasing diode 194. The variable inductor 218 is also coupled in series with to either the edge ring electrode 111 or the substrate electrode 109. The variable inductor 218 is also coupled to stray capacitance 198.

As stated above, voltage can be measured at the edge ring electrode 111 and the substrate electrode 109. Using the measured voltage, the controller 108 determines a voltage ratio of edge ring electrode 111 to the substrate electrode 109. Based on the measured results, the variable capacitor 216 and/or the variable inductor 218 in either or both of the edge ring voltage control circuit 155 or the substrate voltage control circuit 158 can be adjusted to manipulate voltage applied to the edge ring electrode 111, which affects the voltage developed at the edge ring 106 and/or the substrate electrode 109 at the substrate 105. Consequently, the height of the plasma sheath 176 above the edge ring 106 and the substrate 105 can be shaped. The edge ring or substrate voltage waveform amplitude can vary between almost zero to full shaped DC pulse input voltage by varying the variable capacitor 216 and/or the variable inductor 218.

Figure 8:
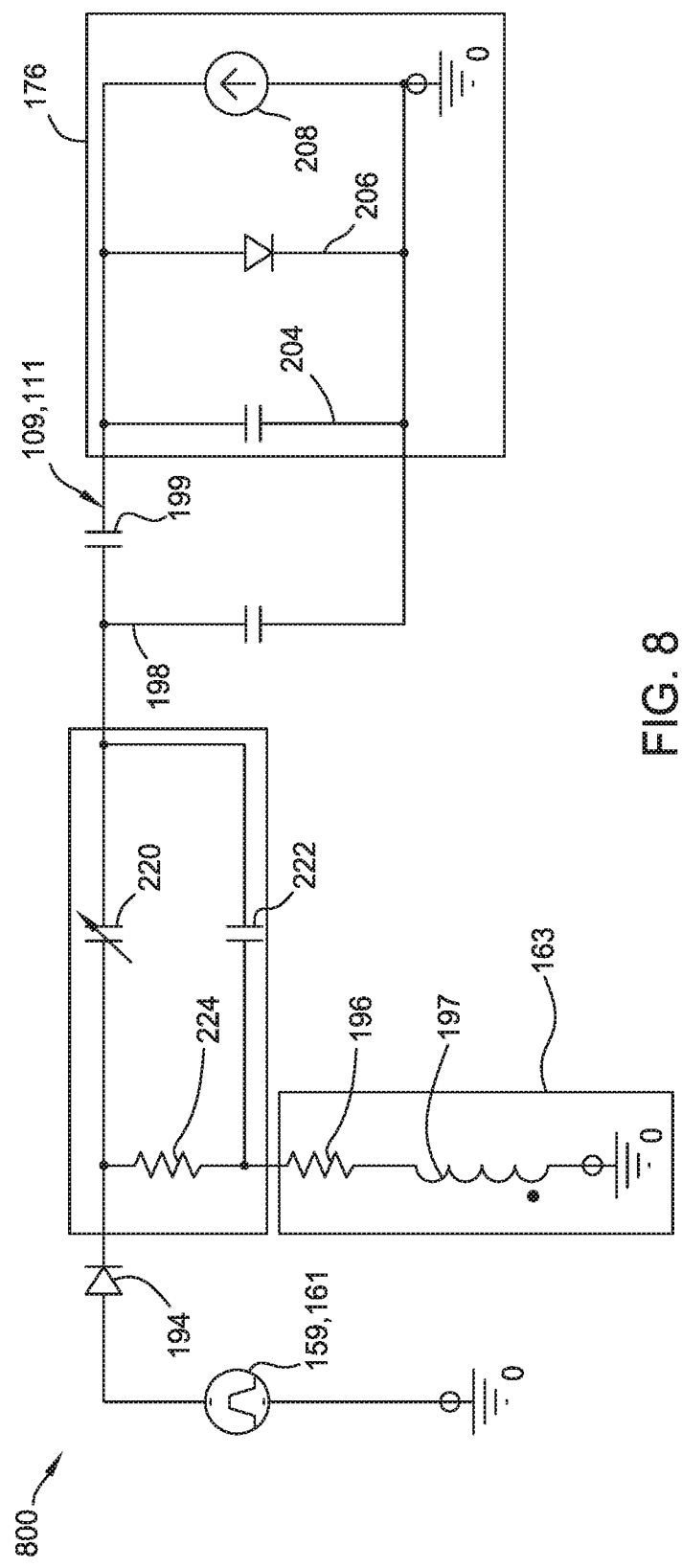
FIG. 8 is schematic circuit diagram illustrating another embodiment of the edge ring voltage control circuit/substrate voltage control circuit for driving the electrodes of the substrate support assembly.

FIG. 8 is schematic circuit diagram illustrating another embodiment of the edge ring voltage control circuit/substrate voltage control circuit 800 for driving the electrodes 109, 111 of the substrate support assembly 104. The first or second shaped DC pulse voltage source 159, 161 is coupled between ground and the forward biasing diode 194, which is coupled to the to a current returning path 163 comprising of a resistor 196 coupled in series with an inductor 197 to ground. A first terminal of a variable capacitor 220 is coupled to the forward biasing diode 194. The first terminal of the variable capacitor 220 is further coupled to a fixed resistor 224, which is coupled to the current returning path 163 and to one terminal of a fixed capacitor 222 the second terminal of the fixed capacitor 222 is coupled to a second terminal of the variable capacitor 220, and to either the edge ring electrode 111 or the substrate electrode 109. The variable capacitor 220 is also coupled to stray capacitance 198.

As stated above, voltage can be measured at the edge ring electrode 111 and the substrate electrode 109. Using the measured voltage, the controller 108 determines a voltage ratio of edge ring electrode 111 to the substrate electrode 109. Based on the measured results, the variable capacitor 220 in either or both of the edge ring voltage control circuit 155 or the substrate voltage control circuit 158 can be adjusted to manipulate voltage applied to the edge ring electrode 111, which affects the voltage developed at the edge ring 106 and/or the substrate electrode 109 at the substrate 105. Consequently, the height of the plasma sheath 176 above the edge ring 106 and the substrate 105 can be shaped. The edge ring or substrate voltage waveform amplitude can vary between almost zero to full shaped DC pulse input voltage by varying the variable capacitor 220.

Figure 9:
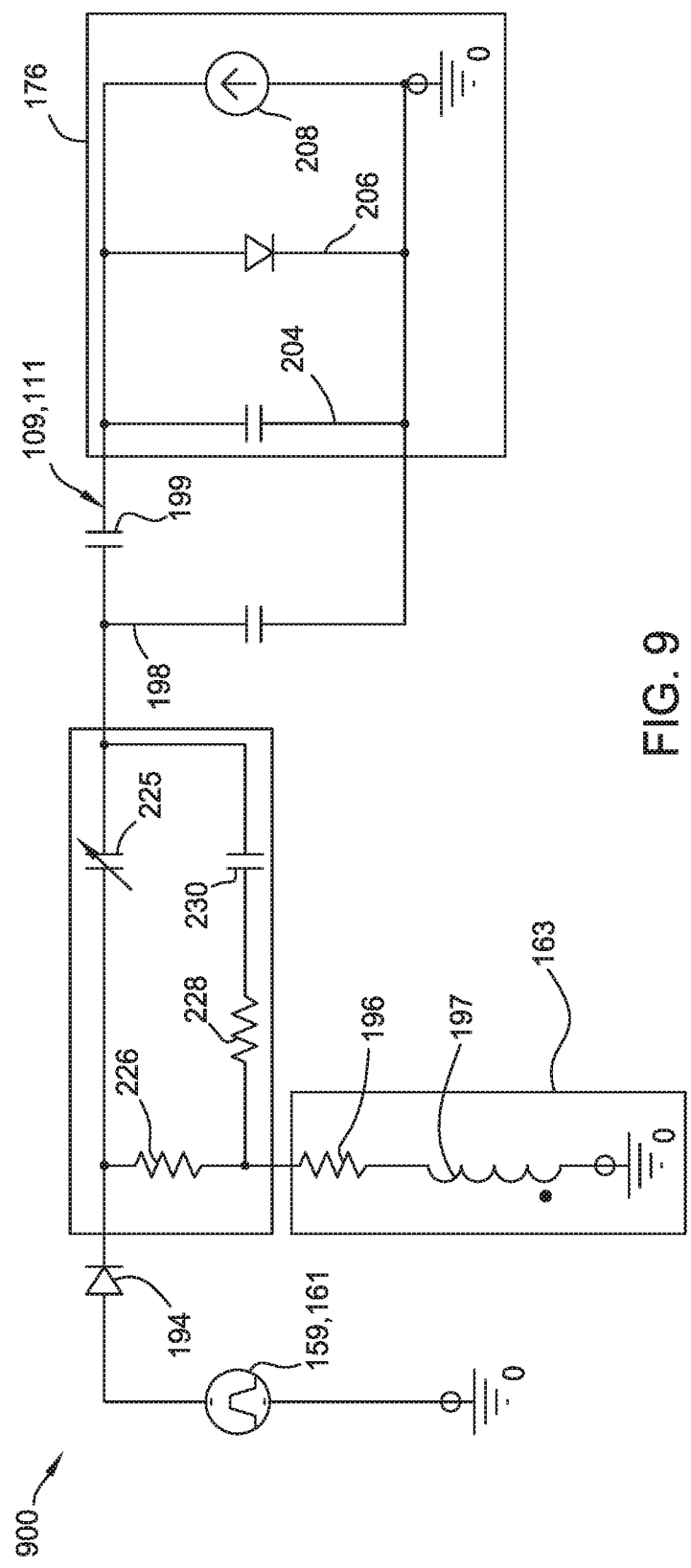
FIG. 9 is schematic circuit diagram illustrating another embodiment of the edge ring voltage control circuit/substrate voltage control circuit for driving the electrodes of the substrate support assembly.

FIG. 9 is schematic circuit diagram illustrating another embodiment of the edge ring voltage control circuit/substrate voltage control circuit 900 for driving the electrodes 109, 111 of the substrate support assembly 104. The first or second shaped DC pulse voltage source 159, 161 is coupled between ground and the forward biasing diode 194. A first terminal of a variable capacitor 225 is coupled to the forward biasing diode 194. The first terminal of the variable capacitor 225 is further coupled to a first fixed resistor 226, which is coupled to the current returning path 163 and to one terminal of a second fixed resistor 228. The second fixed resistor 228 is coupled in series with a first terminal of a fixed capacitor 230. The second terminal of the fixed capacitor 230 is coupled to a second terminal of the variable capacitor 225, and to either the edge ring electrode 111 or the substrate electrode 109. The variable capacitor 225 is also coupled to stray capacitance 198.

As stated above, voltage can be measured at the edge ring electrode 111 and the substrate electrode 109. Using the measured voltage, the controller 108 determines a voltage ratio of edge ring electrode 111 to the substrate electrode 109. Based on the measured results, the variable capacitor 225 in either or both of the edge ring voltage control circuit 155 or the substrate voltage control circuit 158 can be adjusted to manipulate voltage applied to the edge ring electrode 111, which affects the voltage developed at the edge ring 106 and/or the substrate electrode 109 at the substrate 105. Consequently, the height of the plasma sheath 176 above the edge ring 106 and the substrate 105 can be shaped. The edge ring or substrate voltage waveform amplitude can vary between almost zero to full shaped DC pulse input voltage by varying the variable capacitor 225.

Figure 10:
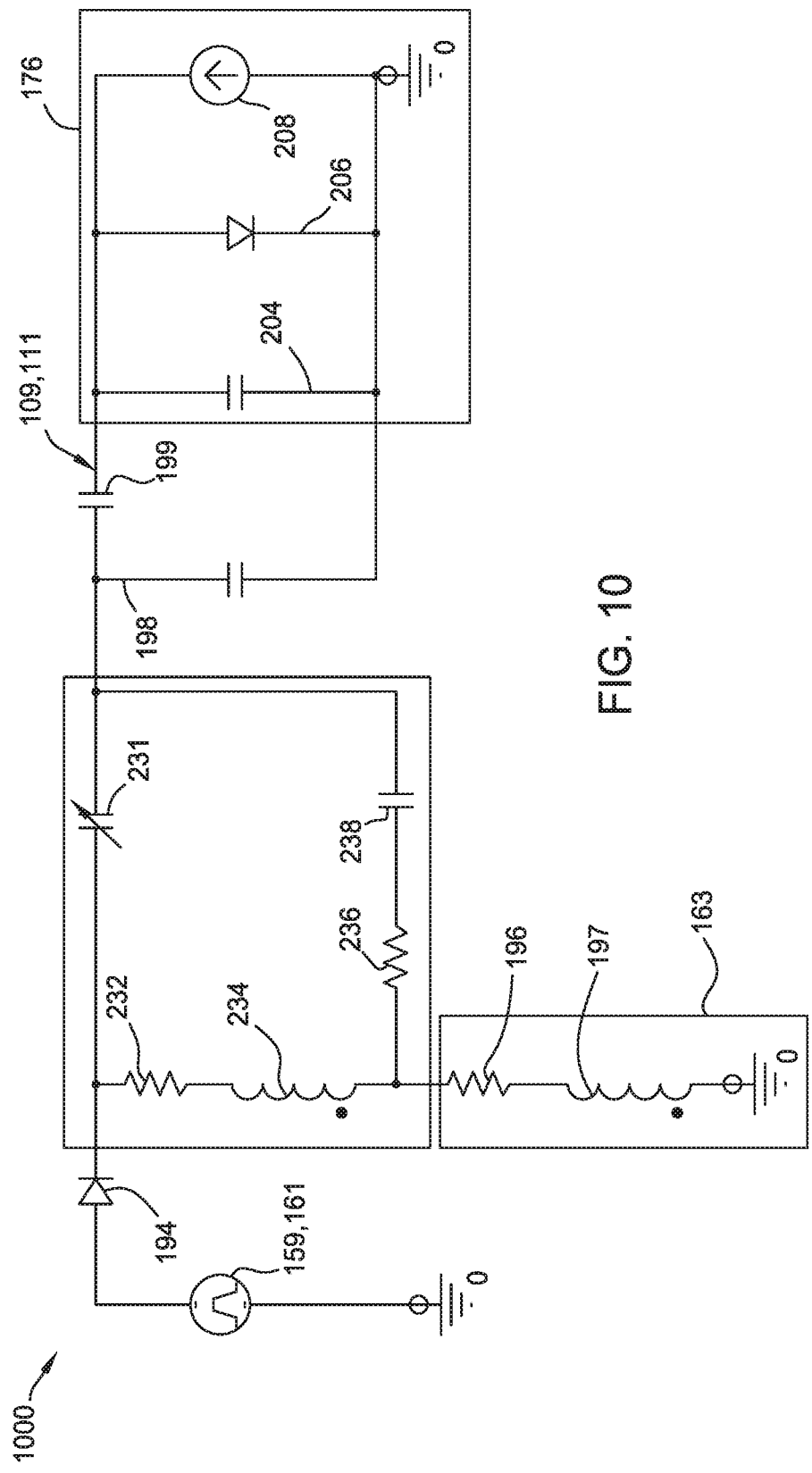
FIG. 10 is schematic circuit diagram illustrating another embodiment of the edge ring voltage control circuit/substrate voltage control circuit for driving the electrodes of the substrate support assembly.

FIG. 10 is schematic circuit diagram illustrating another embodiment of the edge ring control circuit/substrate voltage control circuit 1000 for driving the electrodes 109, 111 of the substrate support assembly 104. The first or second shaped DC pulse voltage source 159, 161 is coupled between ground and the forward biasing diode 194. A first terminal of a variable capacitor 231 is coupled to the forward biasing diode 194. The first terminal of the variable capacitor 231 is further coupled to a first fixed resistor 232 in series with one terminal of a fixed inductor 234. The fixed inductor 234 is coupled to the current returning path 163. The second terminal of the fixed inductor 234 is further coupled to a first terminal of a second fixed resistor 236. The second terminal of the second fixed resistor 236 is coupled to a first terminal of a fixed capacitor 238. The second terminal of the fixed capacitor 238 is coupled to the second terminal of the variable capacitor 231 and to either the edge ring electrode 111 or the substrate electrode 109. The variable capacitor 231 is also coupled to stray capacitance 198.

As stated above, voltage can be measured at the edge ring electrode 111 and the substrate electrode 109. Using the measured voltage, the controller 108 determines a voltage ratio of edge ring electrode 111 to the substrate electrode 109. Based on the measured results, the variable capacitor 231 in either or both of the edge ring voltage control circuit 155 or the substrate voltage control circuit 158 can be adjusted to manipulate voltage applied to the edge ring electrode 111, which affects the voltage developed at the edge ring 106 and/or the substrate electrode 109 at the substrate 105. Consequently, the height of the plasma sheath 176 above the edge ring 106 and the substrate 105 can be shaped. The edge ring or substrate voltage waveform amplitude can vary between almost zero to full shaped DC pulse input voltage by varying the variable capacitor 231.

Figure 11:
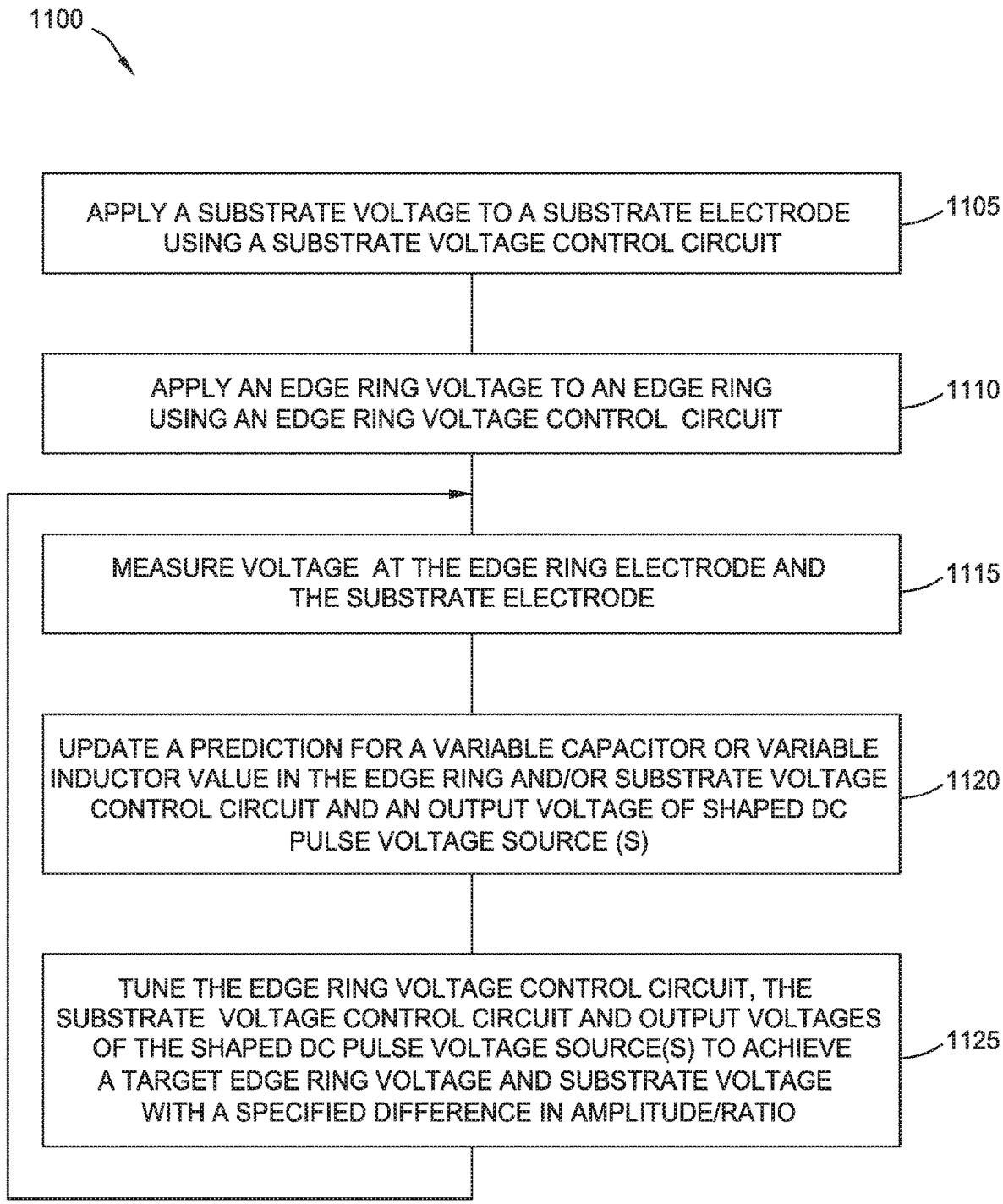
FIG. 11 is a flow diagram illustrating an operation process for the support circuits described above according to one aspect of the disclosure.

FIG. 11 is a flow diagram illustrating an operation process 1100 for the support circuits 155, 158 described above. The operation process 1100 can be implemented using the circuit configurations of FIGS. 4-10 provided in this disclosure. The operation process 1100 also provides a method of operating the process chamber 100.

At operation 1105, the controller 108 applies a substrate voltage to the substrate electrode 109 by the substrate voltage control circuit 158. At operation 1110, the controller 108 applies an edge ring voltage to the edge ring electrode 111 by the edge ring voltage control circuit 155. At operation 1115, the controller 108 measures voltage at the edge ring electrode 111 and the substrate electrode 109. Based on the measured results, the controller 108 determines an amplitude ratio between the voltages of the edge ring 106 and the substrate 105. At operation 1120, the controller 108 updates a prediction for a variable capacitor or variable inductor value in the edge ring voltage control circuit 155 and/or the substrate voltage control circuit 158 and values for the output voltage(s) of the shaped DC pulse voltage source(s) 159, 161. At operation 1125, the controller 108 tunes the edge ring voltage control circuit 155, the substrate voltage control circuit 158, and the output voltage(s) of the shaped DC pulse voltage source(s) 159, 161, in order to achieve the target edge ring voltage and the substrate voltage with specified difference in amplitude (ratio) through feedback control loop 1115, 1120, and 1125.

Figure 12A:
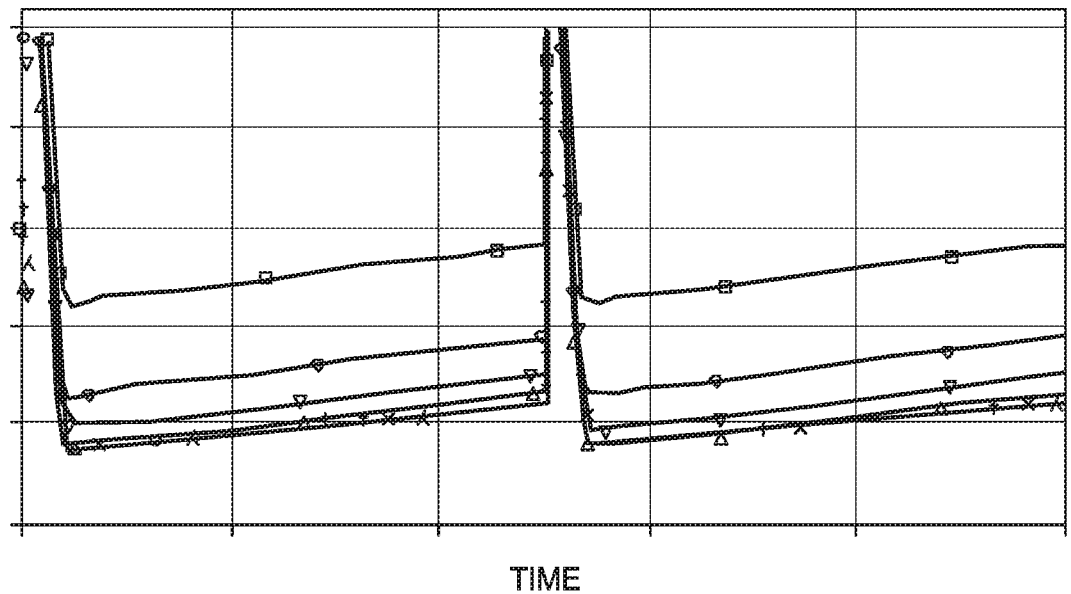
FIGS. 12A and 12B depict example simulation results of modulated an edge ring or wafer voltage waveform created by varying the variable capacitors and/or inductors of FIGS. 4-10 given a shaped DC pulse voltage source.
Figure 12B:
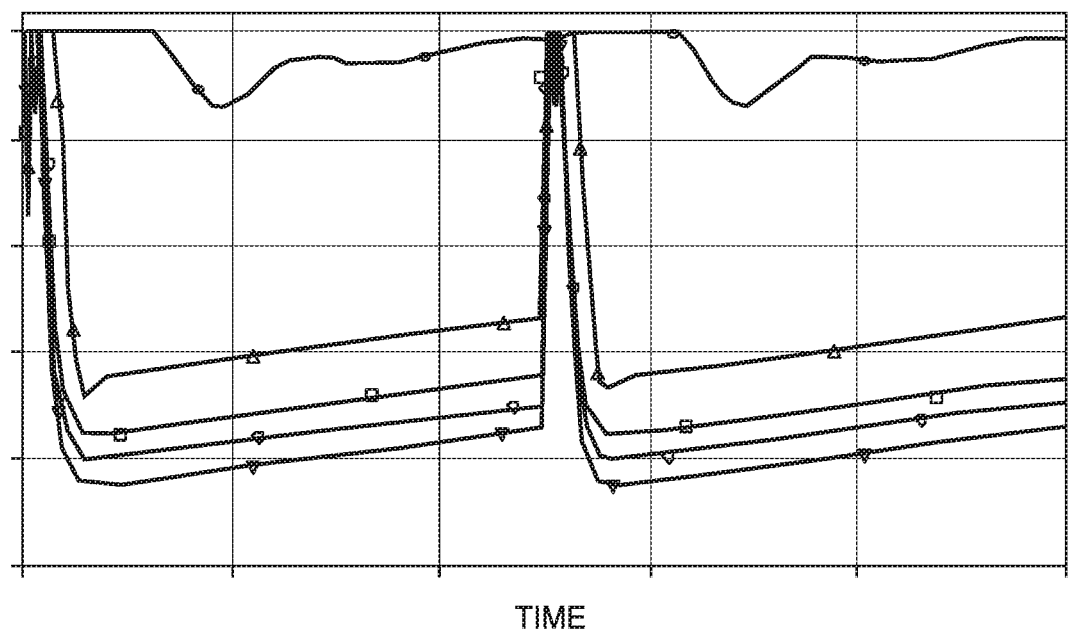

FIGS. 12A and 12B depict example simulation results of modulated edge ring or wafer voltage waveform created by varying the variable capacitors and/or inductors of FIGS. 4-10 given a shaped DC pulse voltage input. For a fixed input voltage amplitude, the variable capacitors and inductors can tune the amplitude of the output voltage of the tuning circuit between almost zero to full input voltage while maintaining the shape of the output voltage to keep a constant voltage difference between the substrate voltage and the edge ring voltage throughout the pulse on-time.

Benefits of the disclosure include the ability to adjust plasma sheaths at the substrate edge in lieu of replacing chamber components, thereby improving device yield while mitigating downtime and reducing expenditures on consumables. Additionally, aspects described herein allow for the plasma sheath to be adjusted at the substrate edge without affecting the plasma parameters at substrate center, thereby providing a tuning knob for extreme edge process profile control and feature tilting correction.

What is claimed is:

1. A substrate support comprising:
a body, the body comprising:
a substrate support portion having a substrate electrode embedded therein for applying a substrate voltage to a substrate;
an edge ring portion disposed adjacent to the substrate support portion, the edge ring portion having an edge ring electrode embedded therein for applying an edge ring voltage to an edge ring disposed on the edge ring portion; and
a low-k dielectric cylindrical layer laterally separating the edge ring portion from the substrate support portion;
an edge ring voltage control circuit coupled between the edge ring electrode disposed in the body and a first pulse DC power source; and
a substrate voltage control circuit coupled between the substrate electrode and a second pulse DC power source, wherein the edge ring voltage control circuit and the substrate voltage control circuit each have at least one variable passive component and wherein the edge ring voltage control circuit is configured to transmit a pulse voltage from the first pulse DC power source through the variable passive component to the edge ring electrode, and wherein the edge ring voltage control circuit and substrate voltage control circuit are independently tunable to supply a difference in direct current voltage between the edge ring and the substrate, and wherein the at least one variable passive component is a variable capacitor or a variable inductor.

2. The substrate support of claim 1, wherein the edge ring voltage control circuit and the substrate voltage control circuit are identical circuits.

3. The substrate support of claim 1, wherein the edge ring voltage control circuit and the substrate voltage control circuit differ from each other.

4. The substrate support of claim 1, further comprising:
a first shaped DC pulse voltage source coupled in parallel to both the edge ring voltage control circuit and the substrate voltage control circuit.

5. The substrate support of claim 1, further comprising:
a first shaped DC pulse voltage source coupled to the edge ring voltage control circuit and
a second shaped DC pulse voltage source coupled to the substrate voltage control circuit.

6. The substrate support of claim 1, further comprising an insulator disposed between the edge ring portion and the substrate support portion.

7. The substrate support of claim 1, wherein the at least one variable passive component comprises a variable capacitor coupled between at least one shaped DC pulse voltage source and the at least one of the edge ring electrode and the substrate electrode.

8. The substrate support of claim 1, wherein the at least one variable passive component comprises a variable inductor coupled between at least one shaped DC pulse voltage source and the at least one of the edge ring electrode and the substrate electrode.

9. The substrate support of claim 1, wherein the at least one variable passive component comprises a variable inductor in series with a capacitor coupled between at least one shaped DC pulse voltage source and the at least one of the edge ring electrode and the substrate electrode.

10. The substrate support of claim 9, wherein the capacitor is a variable capacitor.

11. A process chamber comprising:
a chamber body;
a lid disposed on the chamber body;
an inductively coupled plasma apparatus positioned above the lid; and
a substrate support assembly positioned within the chamber body, the substrate support assembly having a body, the body comprising:
a substrate support portion having a substrate electrode embedded therein for applying a substrate voltage;
an edge ring portion disposed adjacent to the substrate support portion, the edge ring portion having an edge ring electrode embedded therein for applying an edge ring voltage to an edge ring disposed on the edge ring portion; and
a low-k dielectric cylindrical layer laterally separating the edge ring portion from the substrate support portion;
an edge ring voltage control circuit coupled between the edge ring electrode disposed in the body and a first pulse DC power source; and
a substrate voltage control circuit coupled between the substrate electrode and a second pulse DC power source, wherein the edge ring voltage control circuit and the
substrate voltage control circuit each have a variable passive component and wherein the edge ring voltage control circuit is configured to transmit a pulse voltage from the first pulse DC power source through the variable passive component to the edge ring electrode, and wherein the edge ring voltage control circuit and substrate voltage control circuit are independently tunable to supply a difference in direct current voltage between the edge ring and the substrate, and wherein the variable passive component is a variable capacitor or a variable inductor.

12. The process chamber of claim 11, further comprising:
a first shaped DC pulse voltage source coupled in parallel to both the edge ring voltage control circuit and the substrate voltage control circuit.

13. The process chamber of claim 11, further comprising:
a first shaped DC pulse voltage source coupled to the edge ring voltage control circuit and
a second shaped DC pulse voltage source coupled to the substrate voltage control circuit.

14. The process chamber of claim 11, wherein the at least one variable passive component comprises a variable capacitor coupled between at least one shaped DC pulse voltage source and the at least one of the edge ring electrode and the substrate electrode.

* * * * *